United States Patent [19]

Abidi et al.

[11] Patent Number: 5,539,241
[45] Date of Patent: Jul. 23, 1996

[54] MONOLITHIC PASSIVE COMPONENT

[75] Inventors: Asad A. Abidi; James Y.-C. Chang, both of Los Angeles, Calif.

[73] Assignee: The Regents of the University of California, Oakland, Calif.

[21] Appl. No.: 389,732

[22] Filed: Feb. 15, 1995

Related U.S. Application Data

[63] Continuation of Ser. No. 11,509, Jan. 29, 1993, abandoned.
[51] Int. Cl.$^6$ .......................... H01L 29/00; H01L 21/465
[52] U.S. Cl. .......................... 257/531; 257/516; 257/533; 257/535; 257/521; 257/622; 437/228; 437/919; 437/927
[58] Field of Search .................................... 257/516, 531, 257/533, 535, 522, 622; 437/228, 919, 927

[56] References Cited

U.S. PATENT DOCUMENTS

| | | | |
|---|---|---|---|
| 4,696,188 | 9/1987 | Higashi | 357/622 |
| 4,706,061 | 11/1987 | Johnson | 257/622 |
| 4,825,693 | 5/1989 | Bohrer et al. | 257/622 |
| 5,095,357 | 3/1992 | Andoh et al. | 257/531 |

OTHER PUBLICATIONS

R. M. Warner (ed.), *Integrated Circuits; Design Principles and Fabrication*, McGraw–Hill, New York, 1965.
M. Caulton, S. P. Knight, and D. A. Daly, "Hybrid Integrated Lumped Element Microwave Amplifiers", *IEEE Trans. on Electron Devices*, vol. ED–15, pp. 459–466, Jul. 1968.
N. M. Nguyen and R. G. Meyer, "Si IC–Compatible Inductors and LC Passive Filters", *IEEE Journal of Solid–State Circuits*, vol. 25, pp. 1028–1031, Aug. 1990.
M. Parameswaran, A. M. Robinson, D. L. Blackburn, M. Gaitan and J. Geist, "Micromachined Thermal Radiation Emitter from a Commercial CMOS Process", *IEEE Electron Device Letters*, vol. 12, pp. 57–59, Feb. 1991.
H. M. Greenhouse, "Design of Planar Rectangular Microelectronic Inductors", *IEEE Transaction on Parts, Hybrids and Packaging*, PHP–10, pp. 101–109, Jun. 1974.
R. Frlan, S. Meszaros, M. Cuhaci and J. S. Wight, "Computer Aided Design of Spiral Transformers and Inductors", pp. 661–664, Carleton University.
J. C. Marshall, M. Parameswaran, M. E. Zaghloul and M. Gaitan, "High–Level CAD Melds Micromachined Devices with Foundries", *IEEE Circuits and Devices Magazine*, vol. 8, No. 6, pp. 10–17, Nov. 1992.

*Primary Examiner*—Edward Wojciechowicz
*Attorney, Agent, or Firm*—Loeb & Loeb

[57] ABSTRACT

An integrated circuit having a monolithic device such as an inductor suspended over a pit in the substrate to reduce parasitic capacitances and enhance the self-resonant frequency of the inductor.

32 Claims, 7 Drawing Sheets

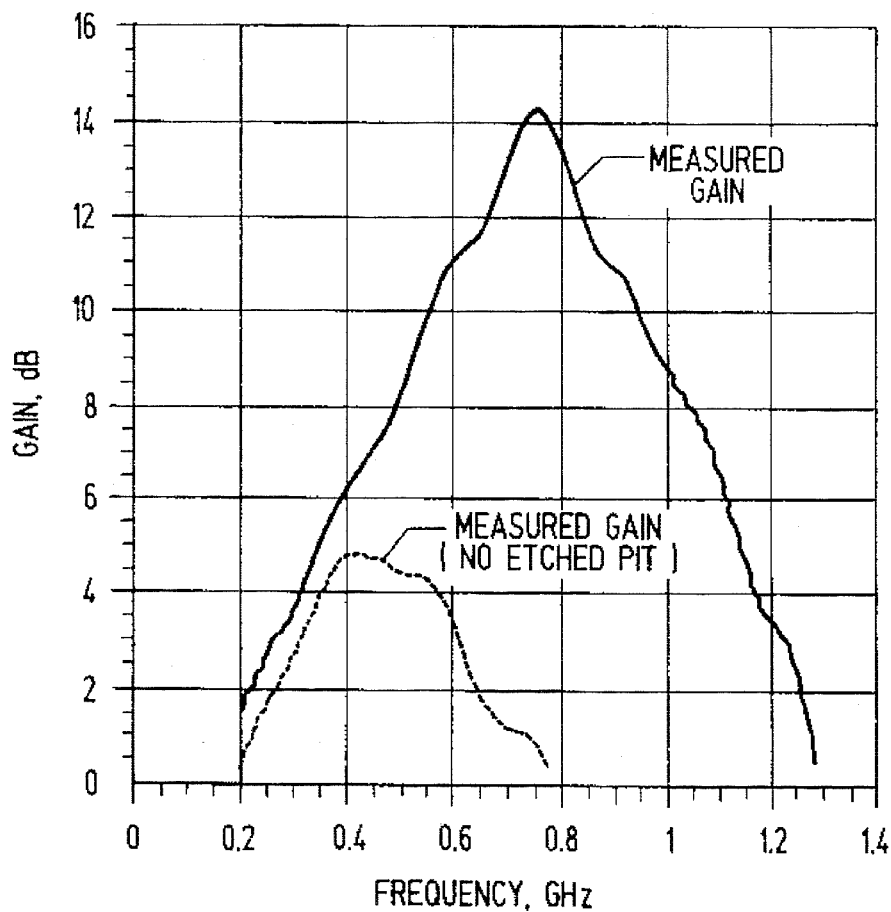
FIG. 3
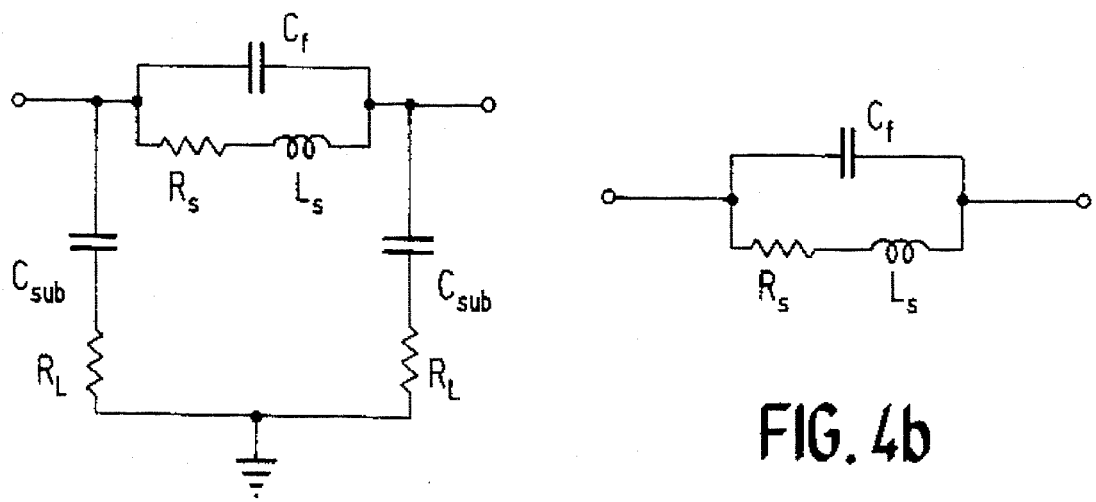
FIG. 4a
FIG. 4b

MONOLITHIC PASSIVE COMPONENT

This is a continuation of application Ser. No. 08/011,509 filed on Jan. 29, 1993, now abandoned.

BACKGROUND OF THE INVENTION

1. Field of the Invention

The present invention relates to integrated circuits, and more particularly to integrated circuits having monolithic passive components.

2. Description of Related Art

There are numerous advantages to integrating not only the transistors but also the inductors and other passive components of a circuit onto a single monolithic substrate. For example, the manufacturing costs and the power consumption of the circuit can be substantially reduced by integrating the circuit onto a single chip. However, in some applications, it has not been practical to integrate inductors of sufficient size to meet the requirements of the circuit.

For example, a radio frequency (RF) amplifier typically employs a tuned load which has both inductive and capacitive components, to act as a secondary filter to filter out-of-band signals and noise. In addition, the tuned load can provide gain by using the LC resonance of the load to null out device parasitic capacitances at the center frequency. Previously, inductors for tuned loads and other applications have been formed on silicon substrates, usually in the form of a planar spiral. However, because the silicon substrate underlying the inductor is a semiconductor material, there is usually a significant parasitic capacitance between the inductor and the underlying substrate. For those applications requiring a relatively large inductor, this parasitic capacitance can dominate, thereby sharply reducing the self-resonant frequency.

Studies of previous techniques for fabricating monolithic inductors on silicon substrate have shown that monolithic inductors have often been limited to 10 nanohenries or less if a self-resonance beyond 2 GHz is desired. For many applications, it is highly desirable to have an inductance substantially in excess of 10 nanohenries. For example, to reduce power consumption, it is highly desirable to have an inductor of at least 100 nanohenries. Reduction of power consumption is of an extreme importance in portable, battery powered applications utilizing RF tuned circuits, such as miniature wireless communicators.

Because of this limitation on monolithic integrated inductors, applications requiring inductors on the order of 100 microhenries or more have typically used non-monolithic inductors which are separately packaged and coupled to the integrated active circuitry through package pins and printed circuit board wiring. However, the additional wiring requirements of the separate packaging have themselves caused parasitic capacitances. These parasitic capacitances are typically overcome by increasing the power consumption of the device. This is, of course, undesirable in portable, battery powered devices in which maximum battery life is sought.

It is known to fabricate a tuned amplifier having a monolithic inductor on a sapphire or GaAs substrate. Such devices are typically high frequency devices, on the order of tens to hundreds of Ghz. Because of the very high frequency of operation, the monolithic inductors need have a value of only a few nanohenries of inductance. Such values are readily achieved because GaAs material is a semi-insulating medium. As a consequence, the GaAs substrate on which the inductor is formed provides an essentially non-conducting dielectric insulator beneath the inductor. As a result, the parasitic capacitances of the inductors are very small and the self-resonances of the inductor are very high, as desired.

However, many RF applications require very sophisticated modulation techniques such as spread spectrum modulation, etc. to reduce interference. To date, GaAs fabrication techniques are not generally suited to fabrication of such complex integrated circuitry. Hence, construction of extremely complex integrated RF circuitry having a monolithic inductor on a single GaAs substrate has generally not been practical.

SUMMARY OF THE INVENTION

It is an object of the present invention to provide an improved integrated circuit, obviating, for practical purposes, the above-mentioned limitations, particularly in a manner requiring a relatively uncomplicated arrangement.

These and other objects and advantages are achieved in an integrated circuit having a monolithic energy storing component suspended over the substrate of the circuit. In the illustrated embodiment, the energy storing component is an inductor which is formed in an oxide layer overlying a silicon substrate in which the silicon material underneath the inductor is selectively removed to space the inductor from the underlying silicon substrate. In one embodiment, the space beneath the inductor is filled with an insulating medium such as air so that the parasitic capacitance of the inductor is substantially reduced. As a consequence, the inductor may be relatively large, for example, 100 nanohenries, yet retain a relatively large self-resonant frequency on the order of 2 Ghz or more.

In the illustrated embodiment, the silicon beneath the inductor is removed by etching which leaves the inductor suspended on the oxide layer overlying the substrate. This etching step may be performed after the integrated circuit has been fabricated using standard, commercial silicon fabrication processes such as CMOS. As a consequence, the fabrication of the inductor does not require modification of known commercial fabrication processes which can form very complex circuitry as required for some applications.

These and other objects and advantages will be made more clear in connection with the following detailed description of the drawings identified below.

BRIEF DESCRIPTION OF THE DRAWINGS

FIG. 3 is a graph which compares inductor performance between an inductor formed over a silicon substrate and an inductor as illustrated in FIG. 2.

FIG. 4a shows a schematic diagram of a model of an inductor formed over a silicon substrate.

FIG. 4b is a schematic diagram of a simplified model for a suspended inductor in accordance with the present invention.

DETAILED DESCRIPTION OF THE DRAWINGS

Figure 1:
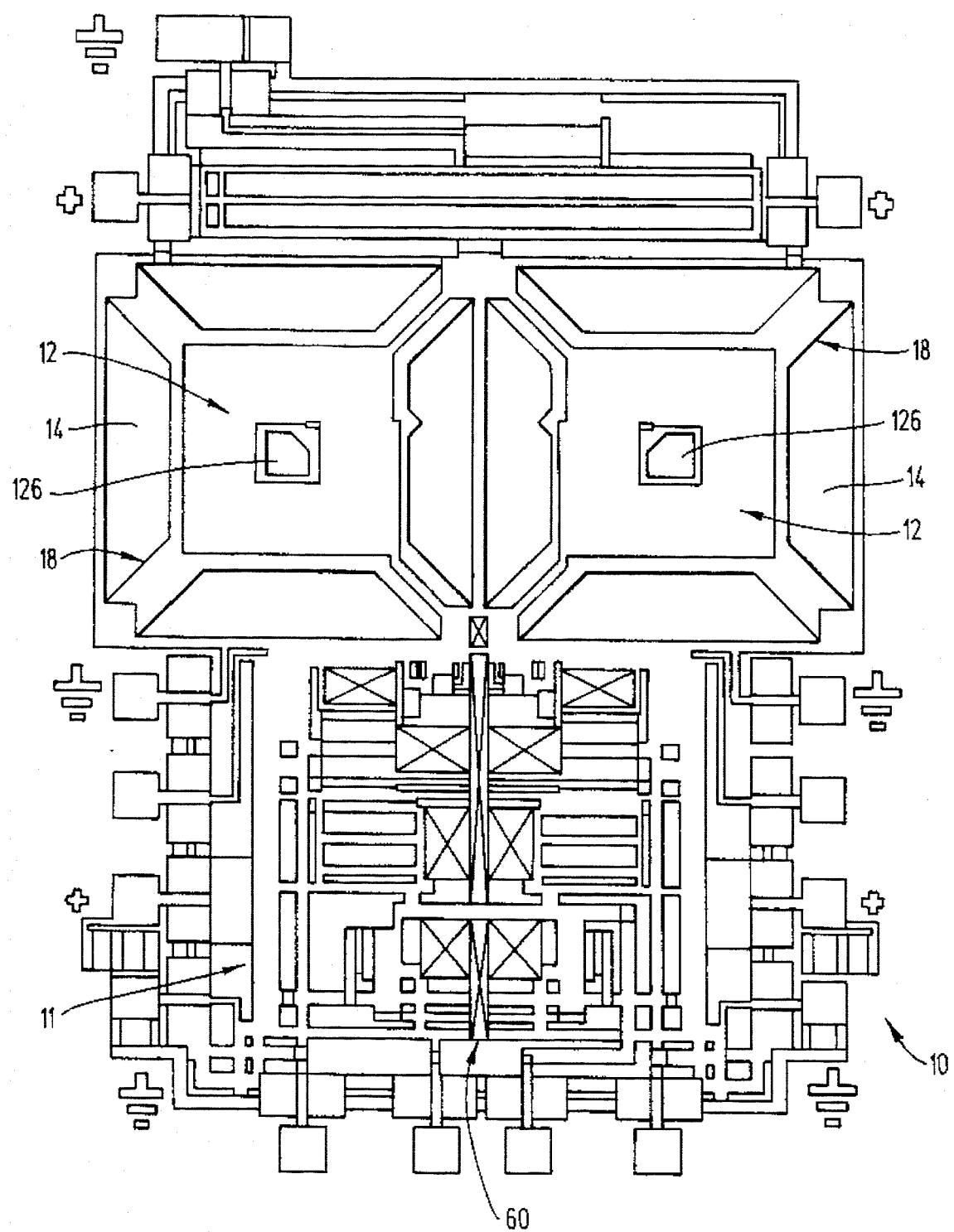
FIG. 1 is a layout of a tuned RF amplifier in accordance with a preferred embodiment of the present invention.
Figure 2:
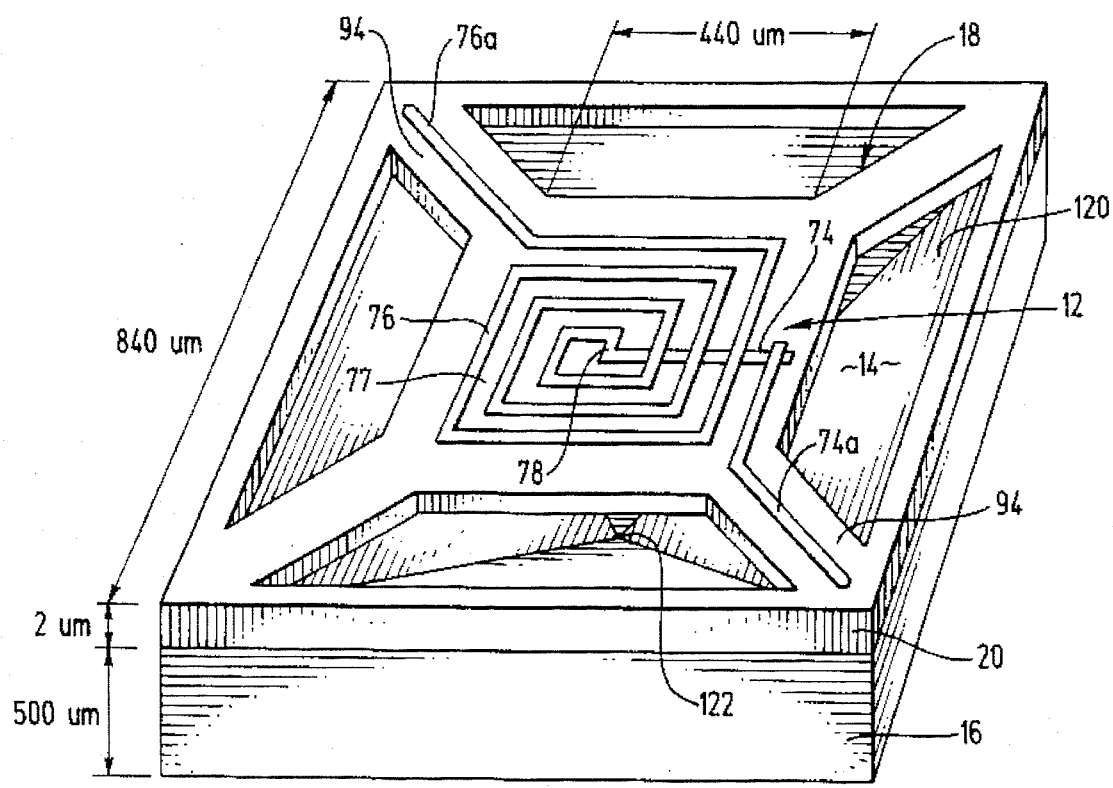
FIG. 2 is a perspective view of the suspended monolithic inductor of the amplifier circuit of FIG. 1.

A layout of an RF tuned amplifier in accordance with a preferred embodiment of the present invention is indicated generally at 10 in FIG. 1. The amplifier 10 has an active circuit portion which includes transistor circuitry 11, and a passive circuit portion which includes two monolithic inductors 12 which are used as the load of the amplifier. In accordance with one aspect of the invention and as best seen in FIG. 2, each inductor 12 is suspended over a pit 14 formed in a silicon substrate 16 underlying the inductor 12. The inductor 12 is encapsulated in and supported by a bridge structure 18 which is formed from an insulative silicon dioxide layer 20 overlying the substrate 16. In the illustrated embodiment of FIGS. 1 and 2, the pit 14 underlying the inductor 12 and its associated support structure 18, is filled with air to insulate the inductor 12 from the surrounding substrate 16. Because the silicon of the substrate 16 is a semiconductor material, prior inductors formed over a silicon substrate have often had associated therewith a large parasitic capacitance. However, because the inductor 12 of the illustrated embodiment is spaced from the silicon substrate 16 by the air-filled pit 14, any parasitic capacitances associated with the inductors 12 have been substantially reduced.

Although the circuit 10 has been described as an RF tuned amplifier, it should be appreciated that the monolithic suspended inductors of the present invention may be used in a variety of other integrated circuits including oscillators. In addition, other energy storing devices including capacitors may be suspended over the substrate to reduce substrate induced losses. As used herein, an "inductor" is a circuit element having an inductance which defines or is the primary component of the impedance of the circuit element. Similarly, the term capacitor refers to a circuit element having a capacitance which defines or is the primary component of the impedance of the circuit element.

Each inductor 12 of the illustrated embodiment of FIG. 1 is a 20-turn (only 3 turns are depicted in FIG. 2 for purposes of clarity) square spiral of 4 micron wide lines 76 of deposited aluminum metal separated by 4 micron spaces 77 with an outer dimension of 440 microns. The inductive value of each inductor 12 has been measured to be in excess of 100 nanohenries. Because of the substantial reduction in parasitic capacitance, the self-resonance of each inductor 12 remains at a very high frequency, approximately 3 GHz. This 100 nanohenries inductive value for the inductor 12 represents an order of magnitude improvement over prior monolithic inductors formed over a silicon substrate and having a self-resonance in excess of 2 GHz. Because the monolithic inductors 12 may have, in accordance with the present invention, a large inductive value without a substantial sacrifice in self-resonant frequency, the performance of the amplifier 10 is significantly enhanced.

FIG. 3 is a graph of the performance of the core amplifier of the RF tuned amplifier 10, in which the monolithic inductors 12 have been suspended over a pit in accordance with the present invention, as compared to the operation of an identical amplifier using inductors in which the oxide layer underlying the inductors is in direct contact with the silicon substrate. This plot depicts the dramatic improvement in inductor performance which may be obtained when the substrate underneath the inductor is selectively removed. It is noted that for the amplifier 10 of the illustrated embodiment, the peak gain occurs at 770 MHz in 2 micron CMOS process. There is a growing need for miniature wireless communicators in this 1 GHz band.

To further explain the improvement in performance provided by a suspended inductor in accordance with the present invention, FIGS. 4a and 4b show two circuit models for a non-suspended inductor and a suspended inductor, respectively. As shown in FIG. 4a, a typical circuit model for an inductor on a grounded silicon substrate is a capacitor $C_f$ in parallel with the combination of an inductor $L_s$ in series with a resistor $R_s$. This combination straddles across two capacitors $C_{sub}$ which represent the parasitic capacitance caused by the silicon substrate underlying the inductor. If the substrate is a lossy substrate such as silicon, a resistor $R_L$ may be included in series with each capacitor $C_{sub}$ and connected to ground.

In contrast, FIG. 4b shows how the circuit model for a suspended inductor in accordance with the present invention can be substantially simplified. Because the suspended inductor is spaced from the silicon substrate by the air-filled pit, the parasitic capacitance $C_{sub}$ and the spreading resistance $R_s$ are substantially reduced such that they can be eliminated from the model. Consequently, the suspended inductor can be modeled simply as the capacitor $C_f$ in parallel with the series combination of the inductor $L_s$ and the resistance $R_s$ as shown in FIG. 4b.

Figure 5:
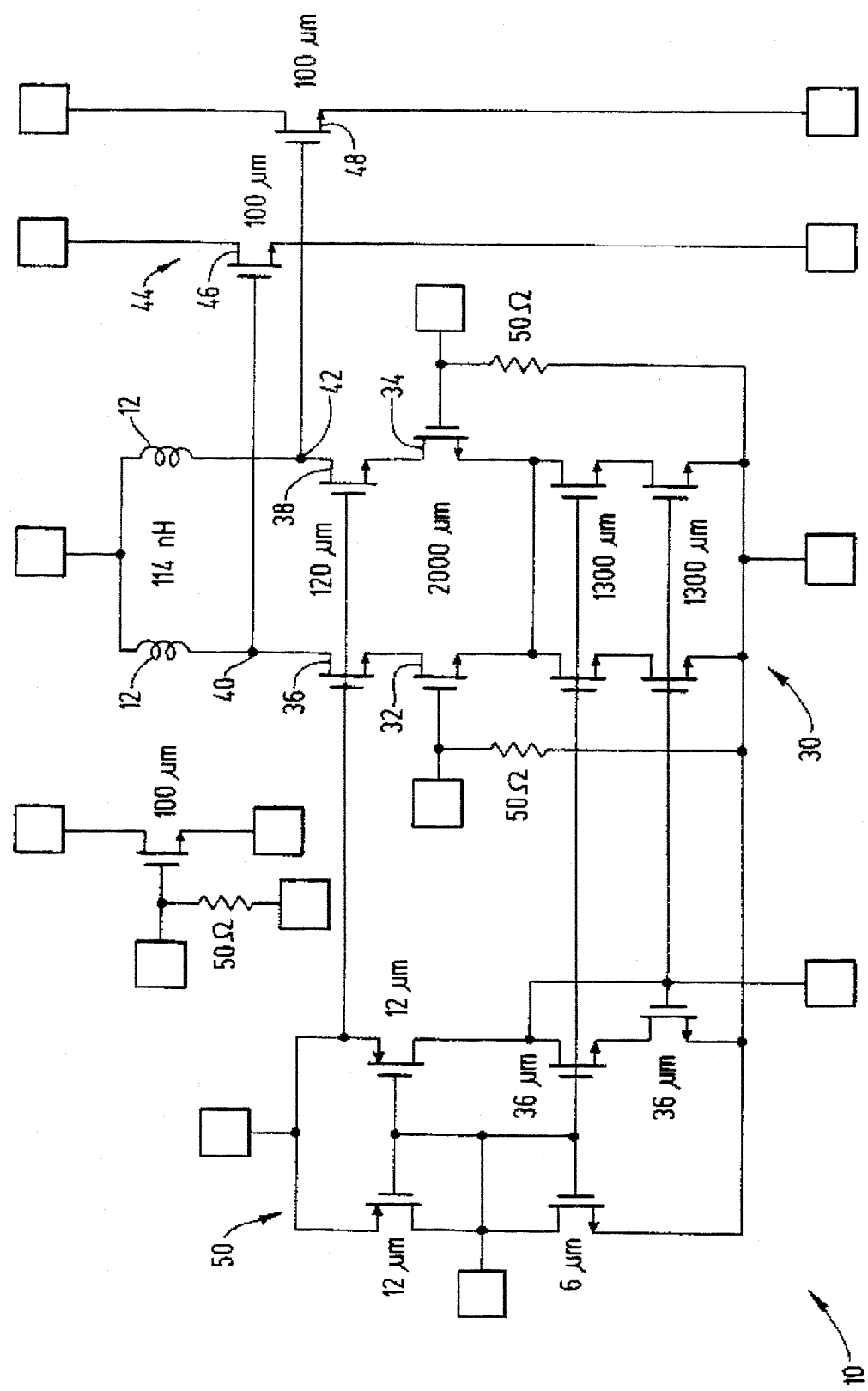
FIG. 5 is a schematic diagram of the RF amplifier circuit of FIG. 1.

As previously mentioned, one example of an application of the monolithic suspended inductor is the RF tuned amplifier 10 of FIG. 1. A schematic diagram of the amplifier 10 is depicted in FIG. 5. As shown therein, the core amplifier of the RF tuned amplifier 10 includes a fully differential cascode amplifier 30 which drives the suspended inductors 12 as loads. The gain of this amplifier is approximately the product of $g_m$ of the input transistors 32 and 34, and the impedance $Z_{load}$ of the inductive load, i.e., the inductors 12. Therefore, in order to achieve high gain while keeping the power consumption to a minimum, it is necessary to maximize the inductive value of the inductive load $Z_{load}$.

In this application, the inductive load $Z_{load}$ is dominated by the impedance, $j\omega L$, of the inductors 12. Since $g_m$ is proportional to power, it follows therefore, that an increase in inductance will achieve a lower power consumption at a given gain. As previously mentioned, the suspended structure of the inductors 12 of the illustrated embodiment allows the inductive value of the inductors 12 to be made relatively large, 114 nH, in the illustrated embodiment, without substantially reducing the self-resonant frequency of the inductors. Here, the self-resonant frequency of the inductors 12 is in excess of 2 GHz such that the RF amplifier 10 may be tuned to approximately 915 MHz. Wireless communicators which can operate in this one GHz band are very important from a commercial standpoint.

In the illustrated embodiment, the cascode devices 36 and 38 of the core amplifier 30 reduce the total parasitic capacitance present at the output nodes 40 and 42 to an output buffer 44. Open drain devices 46 and 48 were selected for the output buffer 44. A biasing high swing cascode current source circuit 50 provides a bias for the core amplifier 30.

As shown in FIG. 1, the RF tuned amplifier circuit 10 has been laid out in lateral symmetry to preserve the differential nature of the circuit. The differential inputs and outputs are separated by a ground plane 60 positioned in the middle of the chip to cutoff signal coupling between the two halves. Input and output signal lines are kept orthogonal to each other to minimize inductive and capacitive coupling. Any transistors wider than 50 microns are laid out in an inter-digitated fashion to minimize junction capacitance and the delay as the signal propagates down the polysilicon gate.

Figure 6A:
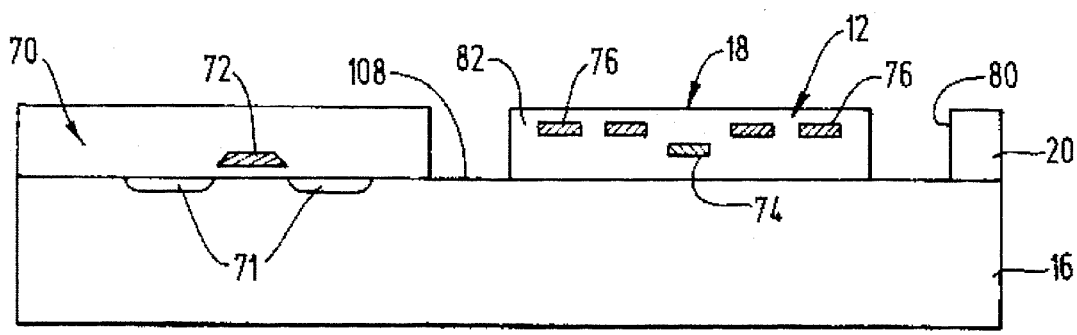
FIGS. 6a–6c are schematic representations of various processing steps for forming the RF amplifier circuit of FIG. 1.
Figure 6B:
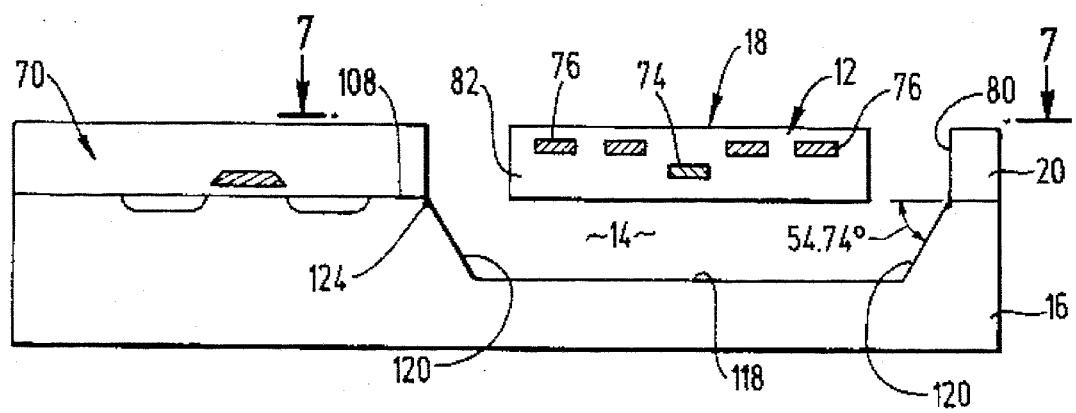
Figure 6C:
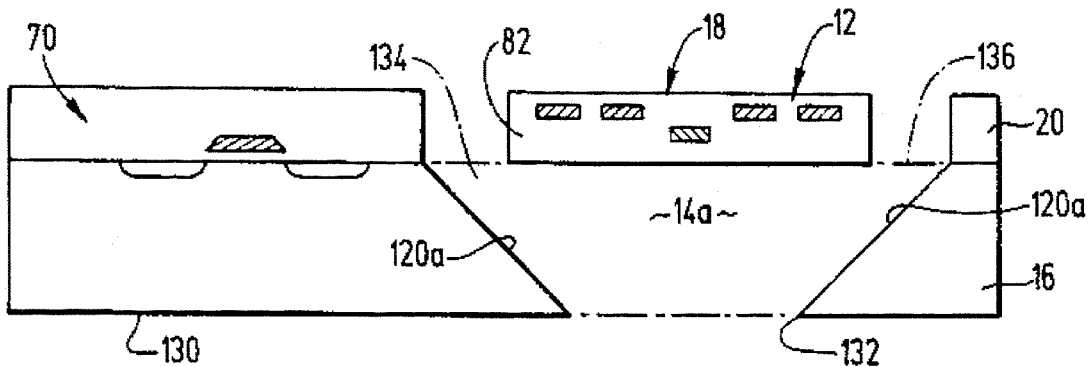

The processing steps for forming the integrated circuit 10 (FIG. 1) are shown graphically in FIGS. 6a–6c. Both of the inductors 12 and all other circuitry of the tuned amplifier 10 including the active transistor circuitry 11 which is represented by an FET transistor 70 having diffusion regions 71, are monolithically formed on the same silicon substrate 16 as indicated in FIG. 6a. At this stage, all circuitry including the inductors 12 have been formed using a standard 2 micron CMOS process (MOSIS) without any modifications. The inductor 12 is encapsulated in the silicon dioxide layer 20 overlying the silicon substrate 16. The silicon dioxide layer 20 may also include polysilicon which was deposited during the formation of the polysilicon gate 72 of the FET transistor 70. The insulating layer may be made of a variety of other materials including silicon nitride. Also, the transistor circuitry may be bipolar as well as FET.

In the illustrated embodiment, the metallization lines of the inductor 12 are formed by sequentially depositing aluminum in two layers as the oxide layer 20 is built up. The inductors 12 are formed at the same time that the interconnecting lines and pads of the amplifier circuit 10 are formed during the standard CMOS process steps. A metallization line 74 formed in a first metallization step over the partially formed oxide layer 20 provides a lead line to the center of the inductor 12 as best seen in FIG. 2. After covering the first metallization line 74 with a subsequent sublayer of the oxide layer 20, a second metallization line 76 is formed in a second metallization layer. As best seen in FIG. 2, the second metallization line 76 is shaped in the form of a square planar spiral which is connected at its center 78 to the underlying first metallization line 74. The metallization lines 74 and 76 are connected to other circuitry of the RF amplifier 10 by lead lines 74a and 76a, respectively. Although the inductors 12 have been illustrated as square spirals, it should be appreciated that other spiral shapes including circular and polygonal (e.g., hexagon and octagon) shaped spirals, as well as non-spiral shaped inductors such as "omega" shaped inductors, may be used as well.

The open regions in the oxide layer 20 are formed along with the formation of active regions, diffusion contacts, first to second layer metallization vias, and passivation cuts. Each open area is therefore defined by using the same masks as those normally used in a standard CMOS process. At this stage, the RF amplifier 10 is complete with the oxide openings 80 as shown in FIG. 6a.

Figure 7:
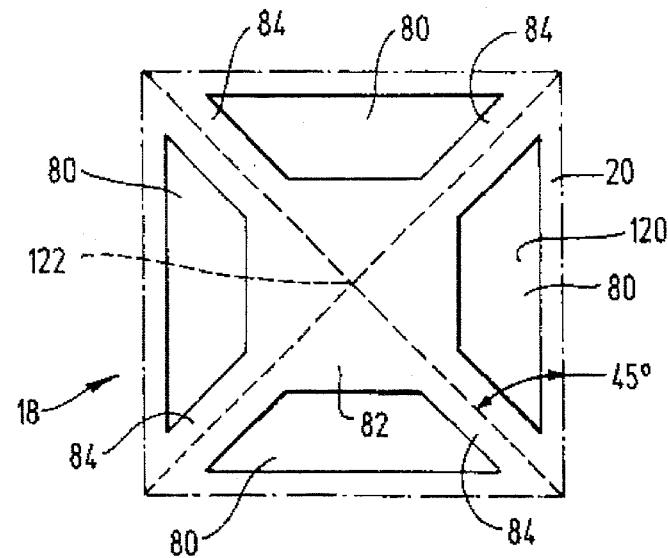
FIG. 7 is a top view of the insulative support structure for the suspended inductor of FIG. 2.

FIG. 7 is a top view of the inductor support structure 18. As shown therein, the support structure 18 has four generally trapezoidal-shaped openings 80 which are formed about a center portion 82 of the oxide layer 20 which encapsulates the inductor 12. The openings 80 are arranged in a "picture frame" pattern about the four sides of the oxide center portion 82. Spacings between adjacent openings 80 form oxide extension portions 84 between the center island 82 and the surrounding portion of the oxide layer 20. The openings 80 are formed using standard masking techniques.

Figure 8:
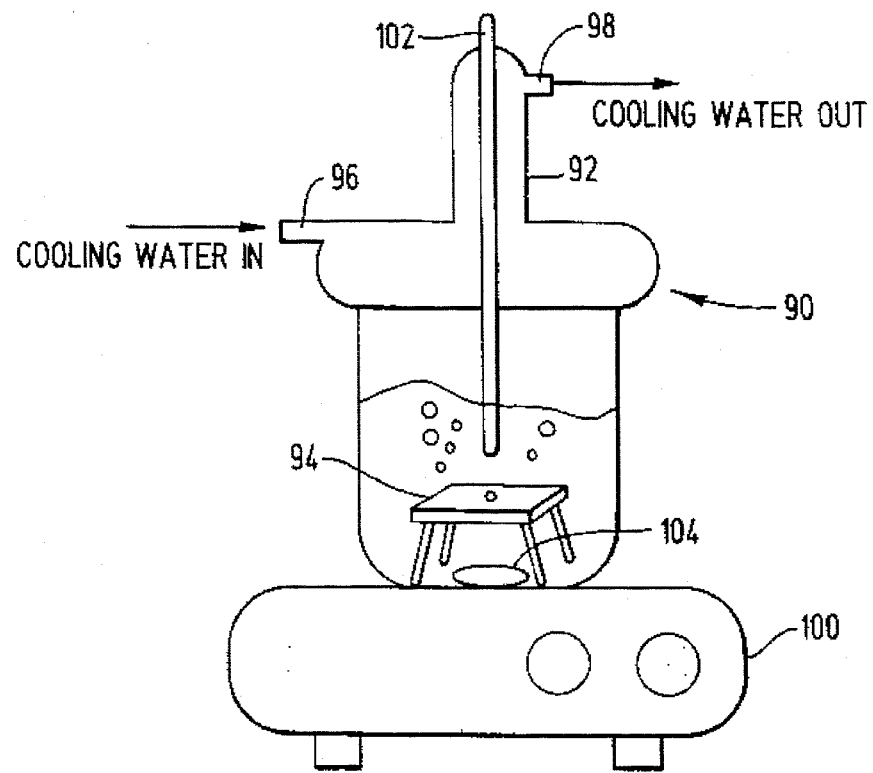
FIG. 8 is a schematic representation of an apparatus for etching pits beneath the monolithic inductors of FIG. 1.

An etchant is applied through the openings 80 to form the pit 14 beneath the inductor 12 as shown in FIG. 6b. An anisotropic etching procedure as schematically depicted in FIG. 8, is performed in a quartz reflux condenser 90 which is a beaker-like container having a special cooling cover 92 which condenses vapor. In the illustrated embodiment, the etchant used is a mixture of ethylene diamine, pyrocatechol and pyrazine, also known as EDP. This etchant allows both silicon dioxide and aluminum to be used as masking materials. CMOS chips are covered with silicon dioxide for passivation and the bond pads are formed from aluminum in the aluminum metallization process. As a consequence, the only exposed areas which will react to the etchant are those areas of the top surface 108 of the silicon substrate 16 beneath the openings 80 in the silicon dioxide layer 20. Thus, special masks during the pit etching step of FIG. 6b are not required. Instead, the oxide layer 20 itself provides the masking function.

After the openings 80 have been formed in the oxide layer 20 around the inductor 12 as shown in FIGS. 6b and 7, the chip is placed on a device carrier 94 within the reflux condenser 90. The cooling cover 92 of the condenser 90 has an inlet 96 and an outlet 98 for cooling water to condense vapors within the reflux condenser 90 so as to keep the concentration of the etchant, and thus the etch rate, constant. The etchant is heated by a stirring hot plate 100° to 97° C. as measured by a thermometer 102. The heated etchant is stirred constantly by a stirrer 104 for 5 to 6 hours. The exact time required depends upon the size of the pits 14 desired, the concentration of the etchant, and the etchant temperature. The etch rate of this particular etchant, EDP, is approximately 50 microns p/hr. in the <100> crystallographic direction. The above-described process need not be performed in a clean room, although deionized water should be available for rinsing the device after each etch.

As previously mentioned, the openings 80 through the oxide layer 20 expose the surface 108 of the underlying silicon substrate 16. In order to maintain control over the direction of the anisotropic etch, the layout of the openings 80 should be aligned to lines corresponding to the intersection of the {111} crystallographic plane and the wafer-surface plane. It is noted that standard CMOS foundries use round (100) silicon wafers for standard CMOS processes. The round wafers are supplied with a flat surface that is oriented along this (110) intersection, and the chips are aligned with respect to the wafer flat surface.

In the illustrated embodiment, the orientation of the openings 80 as viewed in FIG. 7 is rotated 45° with respect to the x–y coordinate grid defined by the crystalline structure of the exposed (100) surface 108 of the silicon wafer. As the etchant is applied through the openings 80, the pit 14 is formed with a flat bottom 118. The sidewalls 120 (FIG. 6b) of the pit are bounded by the {111} planes and form a 54.74° angle with respect to the silicon surface plane (100). Most of the etching occurs at the bottom 118 of the pit 14. If allowed to continue, the four sidewalls 120 finally intersect at a point 122 (FIGS. 2 and 9), which halts the etching process. As best seen in the top view of FIG. 9, the pit 14 in the silicon substrate 16 has the shape of an inverted pyramid which may or may not be truncated depending upon whether the etching is allowed to proceed to a single vertex 122.

The sidewalls 120 of the pit 14 form a 54.74° angle with the top (100) planar surface 108 because the etch rate of the etchant varies with the direction in the silicon crystal lattice, hence, the term "anisotropic" etch. It is noted that the etch rate is significantly lower in the <111> direction than in the <100>direction. The etch rate ratio for the EDP etchant used in the preparation of the integrated circuit of the illustrated embodiment is approximately 1:35. Therefore, the {111} planes function nearly as etch stops.

It is noted that there is some undercutting of the silicon-silicon oxide surface at 124 (FIG. 6b), because the etch rate in the <111> direction, although small, is not zero. If desired, this undercutting can be minimized by using a P+boron implant at the perimeter 124 of the openings 80. This P+implant can be included in the standard CMOS process.

Upon completion of the etching process, the inductor 12 will be suspended over the substrate 16 and isolated from the silicon substrate by the pit 14. The metallization lines of the inductor 12 are mechanically supported by the center island portion 82 of the oxide layer, together with the longitudinal portions 94 (FIG. 2) of the oxide layer which interconnect the central island portion 82 to the surrounding portions of the oxide layer 20. As best seen in FIG. 2, the longitudinal portions 94 of the oxide suspension structure carry the connector lines 74a and 76a (FIG. 2) of the inductor 12 to the appropriate portion of the amplifier circuit. Connector lines 74a and 76a can be carried out on any of the four longitudinal suspension structures.

As best seen in FIG. 1, an opening 126 may be formed in the center of the inductor support structure 18. However, such a central opening is not required to etch the underlying pit.

In the illustrated embodiment, the pit 14 underlying the inductor 12 and its oxide supporting structure 18, is filled with air which provides a very satisfactory insulating medium. Because the inductor 12 of the illustrated embodiment is spaced and insulated from the silicon substrate 16 by the air-filled pit 14, any parasitic capacitances associated with the inductors 12 resulting from the underlying substrate 16 have been reduced by an order of magnitude in the illustrated embodiment. As a consequence, the inductor 12 can be made large enough to have an inductive value in excess of 100 nanohenries, yet retain a high self-resonance in excess of 2 GHz. As a result, an RF tuned amplifier can be fabricated having a large value monolithic inductor thereby substantially increasing reliability and also reducing fabrication costs. In addition, the power consumption of the circuit can be substantially reduced, thereby markedly increasing battery life.

Figure 9:
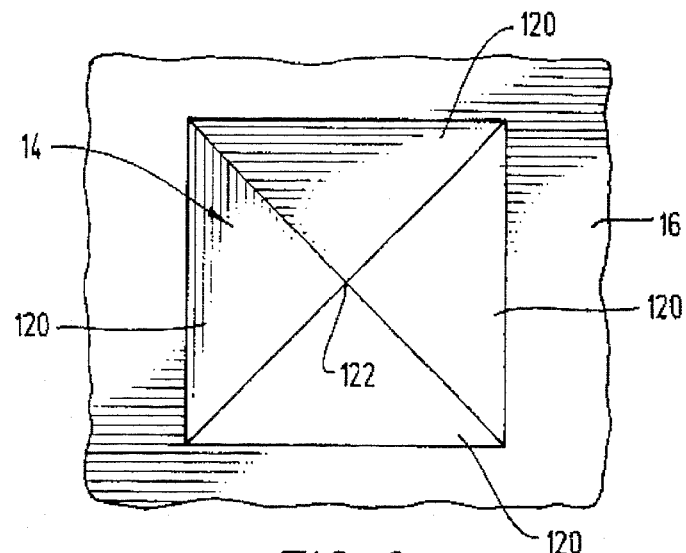
FIG. 9 is a top view of the pit formed in the silicon substrate beneath the suspended inductor.

FIG. 6c shows an alternative embodiment in which the pit below the inductor 12, designated 14a, has been etched all the way through the substrate 16 rather than to a single vertex as shown in FIG. 9. This may be accomplished by forming the openings 80 (FIG. 7) in the oxide layer 20 farther apart so that the {111}planes of the sides 120a of the pit 14a intersect below the bottom surface 130 of the substrate 16. By etching all the way through the substrate 16, an opening 132 is formed in the bottom surface 130 of the substrate 16 to the interior of the pit 14a. Such an arrangement allows ready access to the pit 14 through the underside of the chip should it be desired to fill the pit 14 with an insulating medium 134 other than air.

The insulating medium 134 may be in the form of a liquid which is injected into the pit 14a and later solidifies. The insulating medium 134 may be injected to a level 136 which completely fills the pit 14a and thereby comes into contact with the oxide supporting structure 18 including center island 82 encapsulating the inductor 12. As a consequence, the insulating medium 134 can provide further structural support so that the inductor 12 is not supported solely by the oxide support structure as shown in FIG. 6c.

A magnetic material having a permeability greater than air, such as a ferro-magnetic material, may also be injected into the pit 14a to obtain a higher quality factor Q. A magnetic material may similarly be positioned above the inductor in sufficient proximity so as to be magnetically coupled to the inductor.

Figure 10:
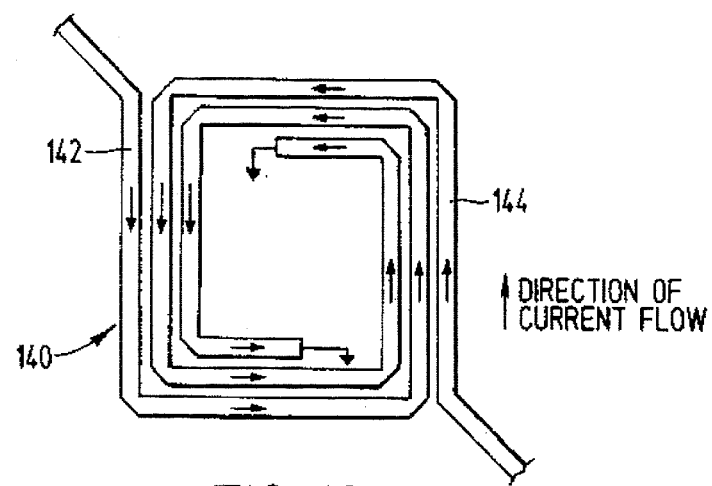
FIG. 10 is a top view of a planar transformer.

It should be appreciated that more than one inductor may be suspended over a single pit. For example, FIG. 10 shows a center-tapped transformer 140 which includes a primary coil 142 and a secondary coil 144. The coils 142 and 144 are each formed as intertwined square planar spirals and may be suspended over a single pit by an oxide support structure in a manner similar to that described for the inductor 12.

Figure 11:
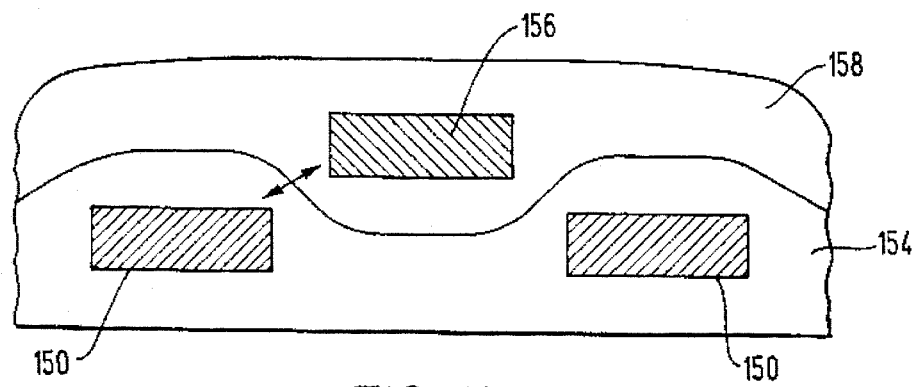
FIG. 11 is a partial cross-sectional view of an inductor in accordance with an alternative embodiment of the present invention.

In addition, the inductors need not have a planar structure. Instead, an inductor can be formed, for example, from two spirals stacked one on top of the other in which one metal layer spirals in and the other spirals out. FIG. 11 shows a cross-section of two metallization lines 150 of a lower metal spiral encased in a first sublayer 154 of the silicon dioxide layer. A metallization line 156 of a top spiral is also depicted in FIG. 7 positioned between the two metallization lines 150 of the lower spiral to reduce interwinding capacitances between the metal layers. The metallization lines 156 of the top-winding are similarly encapsulated in a silicon oxide sublayer 158 of the oxide layer supporting the inductor over a pit. An intermediate air-filled gap could be inserted between the two metal layers to further reduce the interwinding capacitance. This may be achieved by a sacrificial layer between the two metal layers, such as polysilicon, which can later be etched away along with the underlying silicon.

Furthermore, capacitors can be formed in the insulating layer and positioned over a pit in the substrate to reduce losses induced by the substrate. To form a capacitor, spaced, parallel sheets of metallization are deposited in the oxide layer.

As seen from above, the present invention provides a unique structure which facilitates the construction of integrated circuits with monolithic capacitors or inductors. By removing material by etching or other micro-machining techniques from the substrate underlying an inductor, parasitic capacitance can be substantially reduced and the self-resonance of the of the inductor enhanced. As a consequence, highly practical RF-tuned amplifiers and their passive loads can be fabricated on a single monolithic integrated circuit chip.

It will, of course, be understood that modifications of the present invention, in its various aspects, will be apparent to those skilled in the art, some being apparent only after study and other being matters of routine electronic design and semiconductor fabrication techniques. For example, the inductors may have shapes other than square planar spirals and may be formed from metals other than aluminum. As such, the scope of the invention should not be limited by the particular embodiments herein described but should be only defined by the appended claims and equivalents thereof.

We claim:

1. A monolithic integrated circuit, comprising:

a silicon substrate having a surface and provided with a pit which defines a space located below the substrate surface and which opens at the substrate surface;

a plurality of semiconductor circuit elements formed on the substrate;

an insulating layer formed on the substrate and extending across the pit; and a planar spiral inductor positioned over the pit so that the inductor is spaced from the underlying substrate by the pit and supported by the insulating layer, said inductor being one of electrically or mechanically coupled to at least one of the semiconductor circuit elements.

2. The integrated circuit of claim 1 wherein the insulating layer overlying the pit defines a bridge structure which suspends the inductor overlying the pit.

3. The integrated circuit of claim 2 wherein the insulating layer encapsulates the inductor.

4. The integrated circuit of claim 1 wherein the pit is filled with an insulating medium.

5. The integrated circuit of claim 4 wherein the insulating medium is air.

6. The integrated circuit of claim 1 wherein a ferromagnetic core is positioned within the pit.

7. The integrated circuit of claim 1 wherein the semiconductor circuit elements include transistors.

8. The integrated circuit of claim 7 wherein the transistors are interconnected to form an RF amplifier.

9. A process for forming an integrated RF tuned amplifier circuit, comprising the steps of:

forming a plurality of transistors on a silicon substrate;

forming an oxide layer on the substrate and at least a portion of the transistor;

forming a metallization layer on the oxide layer, said metallization layer including a spiral-shaped inductor and a plurality of interconnections which interconnect the transistors and the inductor as an RF amplifier circuit;

applying an etchant through openings in the oxide layer to remove a portion of the substrate beneath the inductor and the oxide layer to form a pit beneath the inductor and the oxide layer to reduce parasitic capacitance between the inductor and the underlying substrate.

10. The process of claim 9 wherein the transistors are CMOS.

11. The process of claim 9 wherein the transistors are bipolar.

12. The process of claim 9 wherein the etchant applying step removes sufficient silicon substrate to reduce the parasitic capacitance by approximately an order of magnitude.

13. A monolithic integrated high frequency circuit, comprising:

a silicon substrate having a surface and provided with a pit which defines a space located below the substrate surface and which opens at the substrate surface;

a plurality of semiconductor circuit elements formed on the substrate;

an insulating layer formed on the substrate and extending across the pit; and a spiral inductor having a planar portion positioned over the pit so that the inductor is spaced from the underlying substrate by the pit and supported by the insulating layer, said inductor being electrically connected to at least one of the semiconductor circuit elements to form the integrated high frequency circuit.

14. The circuit of claim 13 wherein the inductor has an inductance in excess of 1 nH.

15. The circuit of claim 13 wherein the pit is filled with an insulating gas and the device is suspended over the gas-filled pit by the insulating layer.

16. The circuit of claim 6 wherein the insulating gas is air.

17. The circuit of claim 13 wherein the device is encapsulated in the insulating layer.

18. The circuit of claim 13 wherein the layer portion overlying the pit defines a plurality of openings.

19. The circuit of claim 18 wherein the layer portion defines a central island portion carrying the device, and further defines elongated portions positioned between adjacent openings and coupling the central island portion to the surrounding layer and suspends the central island portion over the pit.

20. The circuit of claim 19 further comprising a conductor coupled to the inductor and supported by an elongated layer portion overlying the pit.

21. The circuit of claim 13 wherein the inductor is spiral-shaped.

22. The circuit of claim 21 wherein the spiral of the inductor is one of circular or polygonal shaped.

23. The circuit of claim 22 wherein the polygonal shape includes one of a square, a hexagon and an octagon.

24. The circuit of claim 13 wherein the inductor has an inductance greater than 1 nH and a self-resonance greater than 10 MHz.

25. The circuit of claim 24 wherein the inductor has an inductance of approximately 100 nH.

26. The circuit of claim 13 further comprising a transistor circuit monolithically formed on the substrate and electrically coupled to the inductor.

27. The circuit of claim 26 wherein the transistor circuit is an RF circuit.

28. The circuit of claim 13 wherein the inductor is a transformer having a primary coil and a secondary coil.

29. The circuit of claim 13, wherein the inductor is an inductor has two stacked planar spirals.

30. A process for forming a monolithic integrated high frequency circuit, comprising the steps of:

providing a substrate having a surface;

forming an insulating layer on the substrate surface;

forming an inductor on the insulating layer so that the inductor is supported by the insulating layer; and removing material from a portion of the substrate to form a pit in the substrate which is located beneath the inductor, thereby reducing parasitic capacitance between the inductor and the substrate, while the inductor remains supported by portions of the substrate surface which surround the pit.

31. The process of claim 30 wherein the of removing material forms the openings in a predetermined orientation so that the pit formed in the substrate has a generally inverted pyramid-like shape.

32. The process of claim 31 wherein the step of removing material is terminated so that the generally inverted pyramid-like shape of the pit formed in the substrate is truncated.

* * * * *